US006529277B1

(12) United States Patent
Weitekamp

(10) Patent No.: US 6,529,277 B1
(45) Date of Patent: Mar. 4, 2003

(54) OPTICAL DEVICES BASED ON RESONANT CONFIGURATIONAL EFFECTS

(75) Inventor: Daniel P. Weitekamp, Altadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/902,474

(22) Filed: Jul. 9, 2001

Related U.S. Application Data

(60) Provisional application No. 60/216,816, filed on Jul. 7, 2000.

(51) Int. Cl.[7] .............................................. G01N 21/55
(52) U.S. Cl. ..................................................... 356/445
(58) Field of Search ......................................... 356/445

(56) References Cited

U.S. PATENT DOCUMENTS

| | | | | |
|---|---|---|---|---|
| 5,011,250 A | * | 4/1991 | Okada et al. ................ | 359/332 |
| 5,157,541 A | * | 10/1992 | Schildkraut et al. ........ | 359/276 |
| 5,166,615 A | | 11/1992 | Sidles | |
| 5,266,896 A | | 11/1993 | Rugar et al. | |
| 5,397,987 A | | 3/1995 | Garritano | |
| 5,570,139 A | * | 10/1996 | Wang .......................... | 348/744 |
| 5,629,624 A | | 5/1997 | Carlson et al. | |
| 5,986,808 A | | 11/1999 | Wang | |
| 6,100,687 A | | 8/2000 | Weitekamp et al. | |
| 6,208,422 B1 | * | 3/2001 | Naya ........................... | 356/445 |

OTHER PUBLICATIONS

"Scanning Interferometric Apertureless Microscopy: Optical Imaging at 10 Angstrom Resolution"; F. Zenhausen et al.; Science Magazine, vol. 269. pp. 1083–1085, Aug. 25, 1995.

"Signal–to–Noise Ratios in Inductive & Mechanical Detection of Magnetic Resonance", John A Sidles and Daniel Rugar, May 31, 1993, The American Physical Society.
"Low–temperature Magnetic Resonance Force Detection", K. Wago et al., Jul. 25, 1995, American Vacuum Society (1996).
"Sub–surface Imaging with the Magnetic Resonance Force Microscope", P.C. Hammel et al., Journal of Low Temperature Physics, vol. 101, Nos. 112, 1995.
"The Theory of Oscillator–Coupled Magnetic Resonance with Potential Applications to Molecular Imaging", John A. Sidles, et al., American Institute of Physics, 1992.
"First Images From a Magnetic Resonance Force Microscope", O. Zuger et al., American Institute of Physics, 1993.
"Magnetic resonance force microscopy", J.A. Sidles, et al., Reviews of Modern Physics, vol. 67, No. 1, Jan. 1995.
"Force Detection and Imaging in Magnetic Resonance", Constantino S. Yannoni, et al., Almaden Research Center.
"Force Detection of Nuclear Magnetic Resonance", D. Rugar et al., Science, vol. 264, Jun. 10, 1994.
"Noninductive Detection of Single–Proton Magnetic Resonance", J.A. Sidles, American Institute of Physics, Jan. 23, 1991.
"Mechanical Detection of Magnetic Resonance", Rugar, C.S. et al., Letter to Nature, Dec. 10, 1992.

\* cited by examiner

*Primary Examiner*—Stephone B. Allen
*Assistant Examiner*—Eric Spears
(74) *Attorney, Agent, or Firm*—Fish & Richardson P.C.

(57) ABSTRACT

Techniques and devices based on configurational effects of at least one pair of parts with one nano-scale part in a nano-scale configuration to produce a resonance-enhanced optical response when subject to a small change in a relative geometrical configuration of the two parts. The resonance may be achieved by either a plasmon resonance or a quantum-confined resonance.

28 Claims, 4 Drawing Sheets

OPTICAL DEVICES BASED ON RESONANT CONFIGURATIONAL EFFECTS

This application claims the benefit of U.S. Provisional Application No. 60/216,816 filed on Jul. 7, 2000.

BACKGROUND

This application relates to techniques and devices that manipulate an optical beam for various applications, including, among others, optical detection and imaging, optical switching, optical computation, and optical storage.

An optical beam can interact with a variety of materials in different material states (e.g., solid, liquid, or gaseous state) under proper conditions. Such interaction may produce an output optical signal through at least one of different optical processes, such as optical scattering, optical reflection, optical transmission, optical emission, optical fluorescence and others. Depending on the nature of the interaction and the application, a particular optical process, e.g., optical transmission, may be selected to produce the output optical signal. It may also be desirable to detect two or more different output optical signals from different processes. In general, the interaction can change one or more properties of the input optical beam. This change can be detected or measured by measuring the output optical signal.

SUMMARY

This disclosure includes techniques based on configurational effects of at least one pair of parts with one nano-scale part in a nano-scale configuration to produce a plasmon-enhanced or quantum-confined optical response when subject to a small change in a relative geometrical configuration of the two parts.

A device according to one embodiment includes first and second parts in which at least one of the parts has a dimension less than one wavelength of an input optical signal. The first part is formed of a material that is responsive to the input optical signal to produce a resonance at or near the input wavelength. Such a resonance characteristic of nano-scale parts may be plasmon resonances when the first part is designed to exhibit an electric conductivity such as being formed of a metallic particle, or a quantum-confinement resonance when the first part is formed of one or more quantum dots of diverse materials. The second part is spaced from the first part by less than one wavelength of the input optical signal. These two parts are arranged to be movable relative to each other and to interact to change a property of an output optical signal produced from scattering the input optical signal as the relative geometric configuration between the two parts changes.

DETAILED DESCRIPTION

Figure 1:
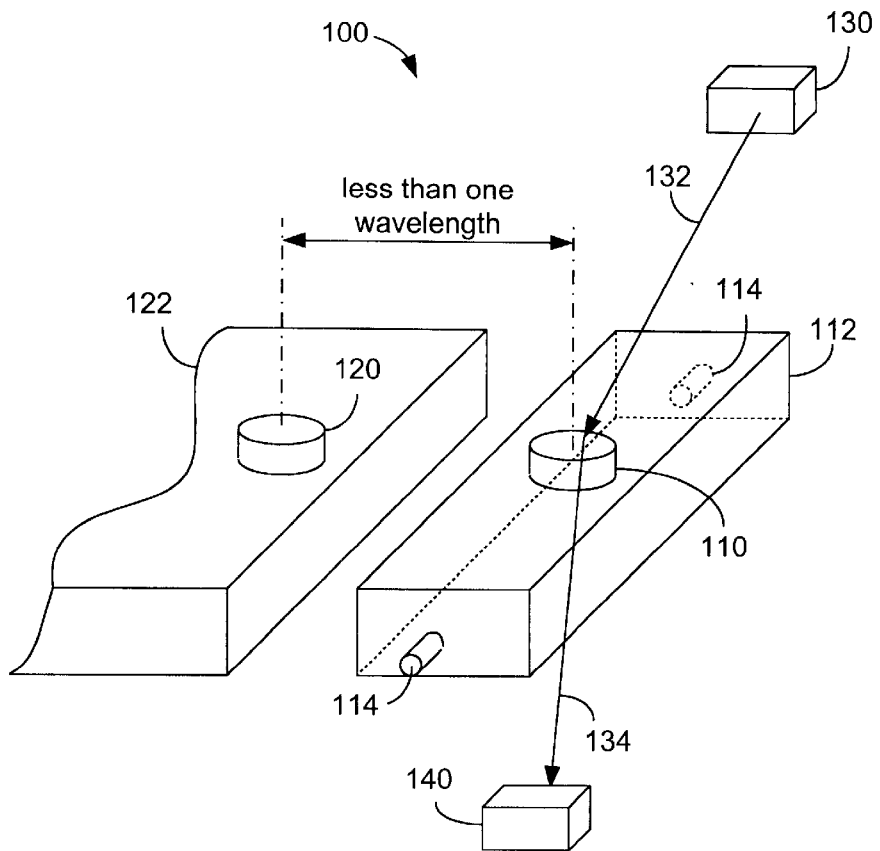
FIG. 1 shows one embodiment of an optical sensor based on resonance-enhanced configurational effects.

The present disclosure is in part based on the recognition that the optical response of a nano-scale structure with two or more parts can have a sensitive dependence on the geometrical configuration of the structure. Here, the "nano-scale" is generally referred to the circumstance where the dimension of at least one part is less than one wavelength of the optical energy involved and the spacing between two adjacent parts as a nano-scale pair, whose geometrical configuration will be modulated, is less than one wavelength of the optical energy. The geometrical configuration includes the geometry, such as the shape and dimension of each individual part and the relative positions, separation, orientations of different parts, and their orientations with respect to the propagation direction or polarization of the input optical field.

Various effects on the input optical field effectuated in such a nano-scale structure are generally configurational in nature because they depend on the geometric configuration of the structure and are distinctively different from the well-known optical diffraction effects where the optical response has a spatial resolution on the order of the wavelength of the optical field. The configurational effects vary strongly with changes in dimensions of the parts or their spatial separations that are far smaller than one wavelength of the relevant incident or outgoing optical waves. As a result, devices based on such may operate beyond the optical diffraction limit. For example, spatial changes much less than one optical wavelength may be measured, which would not be measurable by optical devices operating under the diffraction limit.

In one aspect, the interaction of a pair of the above parts in the nano-structure with an input optical field may be understood as an optical scattering process. Each part responds to the input optical field, i.e., electromagnetic radiation, at an input frequency $\omega_d$, by developing an electromagnetic polarization at the same frequency. Notably, the optical response of each part includes the response to the fields of the other parts. In particular, at least one part is designed to have enhanced optical response due to a resonance at or near the input frequency $\omega_d$. The close presence of the other part causes an interaction between the two parts within the pair and this intra-pair interaction is sensitive to the relative positioning (e.g., spatial separation and relative orientation) of the two parts and their individual shapes and dimensions.

This inter-particle interaction can modify certain aspect of the electromagnetic response (e.g., the polarization) in each part, including its variation with frequency, the polarization, the signal strength, the phase, or the direction of the output optical field. Because of this inter-particle interaction, the scattered light, i.e., the radiating field produced by the modified polarizations in the two parts, is sensitive to the relative geometry of the two particles. In addition, the scattered light is also sensitive to the relative orientation of each particle with respect to the direction and polarization of the input optical field since the induced polarization of each part, even without the inter-particle interaction, is sensitive to this relative orientation.

Notably, at least one of the two parts is designed to have an optical resonance with the input optical field. This optical resonance enhances the signal magnitude and hence the sensitivity of the configurational effects. One way of implementing this optical resonance is to use a material that exhibits an electrical conductivity to produce a plasmon resonance under excitation of the input optical field. For example, a metallic material such as gold may be used to as one part in a two-part pair of the nano-structure. Another way implementing this optical resonance uses one or more quantum dots that produces an optical resonance due to the quantum confinement within dimensions of a few nanometres. Such quantum dots may be formed on semiconductor surfaces such as CdSe nanocrystals inside a self-organized silica template. Due to the quantum confinement of electrons and holes in all three dimensions, quantum dots may be analogous to artificial atoms.

FIG. 1 shows one embodiment of an optical sensor 100 based on the above configuration effects. Parts 110 and 120 are two particles at least one of which has a dimension less than one wavelength of an input optical field 132. The parts 110 and 120 may be respectively engaged to two support media 112 and 122 that are designed to hold the parts 110 and 120. The support media 112 and 122 positioned relative to each other so that the spacing between parts 110 and 120 are less than one wavelength. In addition, the support media 112 and 122 are movable relative to each other and thus the relative geometry of the parts 110 and 120 is not fixed and is changeable in response to a torque or force.

In one implementation, the support medium 122 may be fixed as a static part in space while the support medium 112 may be a movable part. If the relative motion of the parts 110 and 120 is harmonic at a fundamental resonant frequency $\omega_h$, the scattered light includes, in addition to the scattered light at the incident frequency $\omega_d$, scattered signals at newly-generated sidebands, $\omega_d \pm n\omega_h$, where n is an integer and represents the order of the relative harmonic motion. The directions of the sideband signals may be shifted from the direction of the signal at the incident frequency. In addition, the polarization of a sideband signal may be different from the polarization of the incident polarization. The change in the beam property, such as the amplitude, the frequency, the direction, and the polarization, may be used in various applications.

The measurement of this geometry includes irradiating the nano-structure with light at frequency $\omega_d$ at or near the resonance frequency of the nano-structure and measuring the amplitude, frequency, direction and/or polarization of the scattered light. The dominant light scattering process may be described as elastic scattering in which the incident and final photon energies are the same (i.e., at the same frequency). In the case that the parts of the array contain parts in relative motion with mechanical resonance frequency $\omega_d$, additional quasi-elastic processes can occur in which the energy of the scattered light is shifted from that of the incident light by $n\omega_d$, where n is a small integer. In both cases, the sensitive dependence of the scattering cross section on the internal geometry of the nanoscale array is used in various applications.

FIG. 1 illustrates an example where the movable support medium 112 is suspended around a rotational axis 114 to allow for a facile torsional motion. The suspension of part 110 is designed to have a low inertia and thus a small torque or force can cause the part 110 to move relative to the static part 120. The motion of the part 110 changes the relative geometry of the parts 110 and 120 to cause a measurable change in the optical response of the parts 110 and 120. Thus a torque or force on the movable part results in a modification of the cross section for scattering of light by the combined system of movable and static parts 110 and 120. Therefore, the configurational effects due to the change in the relative configuration or geometry of the parts 110 and 120 provides a mechanism to enhance the detection of a small torque or force acting on at least one of the parts 110 and 120 by engendering a large and measurable change in the optical response. This enhancement is based on the plasmon or quantum-confined resonance and the dissipation of energy of the incident beam 132 is small to effectuate an energy-efficient operation of the sensor 100.

In the optical sensor 100 in FIG. 1, a light source 130, such as a laser, is provided to generate the input optical beam 132 which is scattered by the part 110 or 120 to produce a scattered signal 134. An optical detector 140 is positioned to collect and detect the scattered signal 134.

The nano-scale part of the two parts 110 and 120 may be single part such as a quantum dot or a gold particle. It may also be a fluid with volume elements so that its shape may change in response to weak forces. In this case, the relative motion of volume elements within the single part may substitute for a multitude of parts.

The optical sensor 100 based on configurational effects may be used in novel optical, opto-electronic, and opto-mechanical devices. The common feature is that the shape or orientation of nanoparticles or the relative coordinates of nearby nanoparticles is varied to effect a local variation in optical response. These nano-structures can usefully be combined into arrays which may extend over many wavelengths and may additionally include modulation of optical properties on the scale appropriate to diffractive effects and photonic bandwidth effects in order to best take advantage of the local configurational effects.

The operating principles may be illustrated with the example wherein the time-dependent optical properties of the array are determined by the distance separating pairs of nanoparticles. In the simplest example, the pairs would be identical to one another and the intrapair axes would be identically oriented. The centers of masses of the pairs may be randomly or pseudo-randomly distributed in the volume of the device, so that diffractive effects are unimportant. Also, in this simplest approximation, the distances between pairs is taken as sufficiently large that interpair interactions are negligible or can be treated in a mean field approximation. With these approximations, continuum electrodynamics of a uniform medium suffices, the novel feature being the dependence of the optical dielectric tensor on the position vector describing the intrapair orientation and distance, which will be the coordinate modulated by various means in the devices of interest.

An analogous situation of interest is where the pair is replaced by a single particle whose shape is the generalized coordinate modulated to achieve the change in optical response.

More generally, the fundamental unit may be an array of nanoparticles whose various internal and mutual coordinates are modulated. The methods of modulating these coordinates include mechanical forces, electrical (capacitive) forces, magnetic forces, optical forces and thermal expansion. In order to achieve useful changes with small control forces, it may be useful to mount the nanoparticles on elastic suspensions with low spring constants and/or low mechanical dissipation. The control forces may be quasi-static or may be tuned to mechanical resonances of the structures comprised of the particles and their suspensions.

The use in optical devices of nano-structures which scatter light efficiently is consistent with usefully low optical loss when those structures are sufficiently dilute and/or are arranged so that optical absorption is sufficiently low. Structures in which the metallic nano-structures are confined to lines, planes or bounding surfaces can satisfy this property. For example, planes may serve as planes of reflection.

Alternatively, the plane may contain the wavevectors of the optical fields of interest, as when a metallic plane is used to guide a surface plasmon wave or is the center of a waveguide with coupled plasmons extending into the dielectric on both sides. The switching of a given optical frequency from a confined surface plasmon mode to a mode radiating at an angle to the surface is one application. In one embodiment, this switching can occur by the change in waveguide properties of the surface attendant upon the nano-scale change in the relative geometry of the parts comprising at least part of the waveguide surface.

Figure 2:
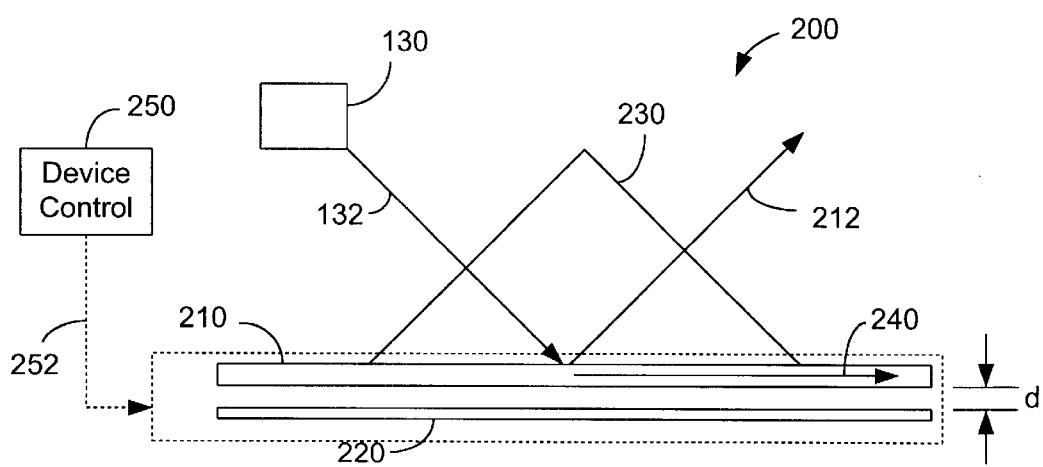
FIG. 2 shows a surface plasmon device based on resonance-enhanced configurational effects.

FIG. 2 shows one exemplary optical plasmon device 200 based on the above configuration effects. A thin metallic layer 210 is provided to produce surface plasmon waves upon excitation of an optical input beam 132 from a light source 130 when the p-polarization of the beam 132 satisfies a surface plasmon resonance condition, i.e., the component of the optical wavevector along the surface of the metallic layer 210 matches the plasmon wavevector. See, e.g., U.S. Pat. No. 5,986,808 to Yu Wang. An optical coupling element 230, such as a prism or a grating, may be used to couple the beam 132 in order to satisfy this surface plasmon resonance condition. When the incident angle of the beam 132 is fixed, the optical wavelength that satisfies the resonance condition is a function of the configuration of the metallic layer 210. As a given configuration of the metallic layer 210, a respective surface plasmon mode is excited and the spectral component in the beam 132 that meets the surface plasmon resonance condition is absorbed and is converted into the respective surface plasmon mode. Other spectral components are reflected back in a reflected beam 212. Hence, as the configuration of the metallic layer 210 changes, the surface plasmon resonance condition changes and so does the wavelength of the spectral component that is absorbed. This wavelength-selective property of the surface plasomon excitation provides a tunable mechanism for optical filtering or switching.

The optical plasmon device 200 implements the tuning mechanism by placing a nano-structure layer 220 below the metallic layer 210 at a distance d less than one wavelength of the spectral range of the beam 132 and is coupled so that the layers 210 and 220 can be movable relative to each other. The nano-structure layer 220 may include a plurality of separate nano-scale particles with dimensions less than one wavelength. These nano-scale particles respectively form a plurality of pairs as described above as illustrated in FIG. 1. In each pair, the metallic layer 210 is one part of the pair and the respective nano-scale particle forms another part of the pair. Since the layer 220 is within one wavelength of the incident wavelength, the layer 220 exposes to essentially the same optical evanescent field as the layer 210. Hence, under a surface plasmon resonance condition, both layers 210 and 220 are optically excited and produce optical responses, similar to the operations of the parts 110 and 120 in FIG. 1. The nano-scale particles in the layer 220 may be formed of a material that is not resonant with the input optical field 132 since the layer 210 can produce the needed resonance. Alternatively, the nano-scale particles in the layer 220 may themselves produce optical resonance by being formed of a metal or a quantum dot.

Notably, the above design of the device 200 can operate based on the configurational effects by controlling the spacing d between the layers 210 and 220. As the spacing d, i.e., the configuration of the layers 210 and 220, changes, the interaction between the two parts in each pair changes the optical responses of both layers 210 and 220. This, in turn, changes the surface plasmon resonance condition and hence the optical wavelength that is absorbed. A control device 250 may be implemented to produce a control signal 252 to change the spacing d. In one implementation, the control device 250 may change the spacing mechanically. In another implementation, the spacing d may be controlled and adjusted via an electrostatic interaction between the layers 210 and 220.

The speed, energy cost, and wavelength selectivity of such switching can be improved by superimposing diffractive and refractive effects on the configurational effects described. Thus, gratings, cavities and photonic bandgap structures in one or more dimensions may be used to couple to the nano-structure sensor 100 in FIG. 1 or may be formed from repetitions of such a structure. The sensitive variation of optical response with wavelength in such diffractive or reflective structures allows small changes in local optical response to have usefully large global effects over areas or volumes extending several or many optical wavelengths.

A variety of methods are known for obtaining images by making an optical measurement of the interaction between a small probe tip and the surface to be imaged. An advantage of such methods is that the attainable spatial resolution is substantially better than is possible with diffractive methods. One example is an apertureless near-field scanning optical microscopy that measures the elastic scattering from the combined system of tip and surface as a function of the tip position. The relative position of the tip and sample is modulated and the resulting modulation of the scattered light intensity comprises the signal. See, e.g., Zenhausern et al., "Scanning Interferometric Apertureless Microscopy: Optical Imaging at 10 Angstrom Resolution," Science, Vo. 269, 1083–1085 (1995).

The present plasmon-enhanced configuration effects may also be used in a unique scanning microscope to achieve high detection sensitivity through enhanced light scattering. In one implementation, the modulation of the relative position between the probe tip and the surface to be measured would be replaced and/or augmented by a driven internal motion of a plasmon-enhanced or quantum-confinement-enhanced nano-structure located at the probe tip. This driven motion would lead to modulated scattering from the probe tip even in the absence of a close approach to the sample. The change in this modulated scattering as a function of probe position would comprise the image signal. As with apertureless near-field scanning optical microscopy, this new method would contain optical information due to the effect on the scattering cross section of the interaction between optical frequency moments in the probe tip and the sample when the probe tip and the sample are spatially close. As with atomic force microscopy, it would also contain information on the contact (van der Waals) forces between the probe tip and surface and the associated dissipation, since these would modify the driven internal motion of the tip. The differing dependences of these distinct effects on the tip-sample separation will allow them to be sorted out.

Figure 3:
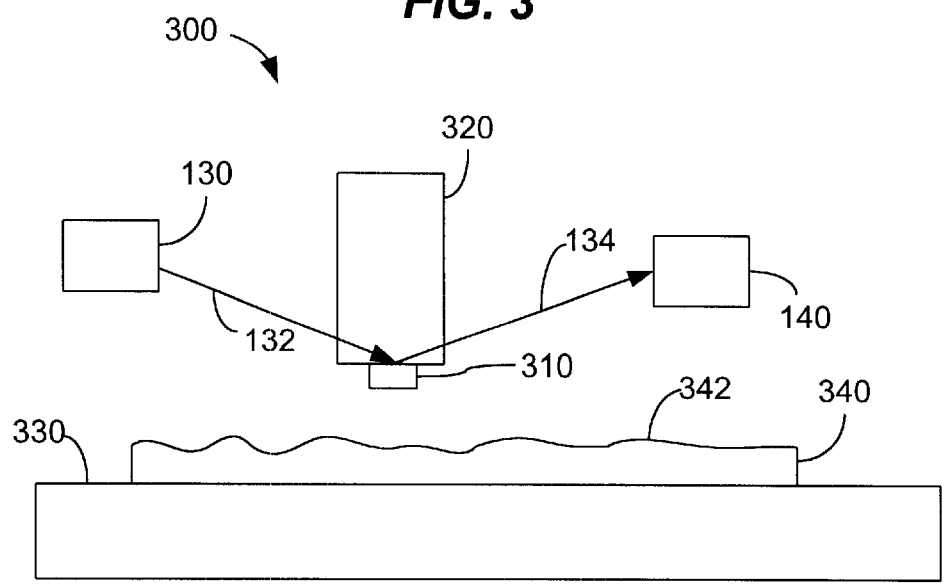
FIG. 3 shows a scanning probe microcope based on resonance-enhanced configurational effects.

FIG. 3 shows one embodiment of a scanning probe microscope 300 that uses a scanning optical probe tip 310 based on the resonance-enhanced configurational effects. The probe tip 310 is constructed based on design shown in FIG. 1 where at least one pair of particles with at least one metallic particle are placed by less than one wavelength from each other. The two particles are coupled to allow for relative motion. A probe holder 320 is used to hold the probe tip 310 and scan the probe tip 310 relative to a sample platform 330. A sample 340 is held on the sample platform 330 and has a sample surface 342 to be imaged. In operation, the probe tip 330 interacts locally with different positions on the sample surface 342 and changes the relative geometry or configuration as described above, this change causes a change in the scattered light 134. Hence, a variation in the signal 134 as a function of the position of the probe tip 310 over the sample surface 342 can be measured. A processing device coupled to the detector 140 is then used to process the data and generate a topographic profile of the surface 342.

A distinct aspect of the present invention is its combination with force-detected optical and magnetic resonance spectroscopes. See, U.S. application Ser. No. 09/576,654 filed on May 22, 2000 by Weitekamp and U.S. Pat. No. 6,100,687 issued on Aug. 8, 2000 to Weitekamp and Leskowitz. In those systems, the forces acting on the mechanical oscillator of the probe tip may include electromagnetic forces between the sample and that oscillator so arranged, by the use of additional electromagnetic fields, to resonantly drive that oscillator. In this context, these are the forces to be measured. The advantage of the present invention in the context of these methods is principally to increase the amount of light scattering associated with a given displacement of the mechanical oscillator and a given incident power. This increase enhances the sensitivity of these methods in situations where they would otherwise be limited by the statistical uncertainty in the measured displacement of the oscillator due to photon-counting statistics or other noise sources associated with low photon-flux at the detector. Thus the present invention allows an extension of these methods to lower temperatures and to smaller moving probe parts, situations in which previously described designs would be dominated by such noise sources. The advantages of lower temperature include a reduction in that noise due to Brownian motion. The advantages of smaller moving parts include better spatial resolution and a lower motional mass, which generally also improves the Brownian-noise-limited sensitivity.

The mechanical motions between probe tip and sample, which are recognized as a necessary part of the various scanning probe methods, and the mechanical motions between optically-coupled parts within the probe tip, which are proposed here, are significantly damped by molecules which collide with the resonators. Thus operation of the mechanical resonator in vacuum is recognized as being advantageous. Since many surface phenomena of interest require the presence of fluids in contact with the surface, the need for a vacuum environment is a constraint on the generality of the methods. Introduction of a vacuum wall between sample and probe increases the distance of closest approach of sample and resonator, thus reducing the force to be detected. This problem is addressed in the present invention by the concept of introducing an intermediary body into the detection process. This body is designed to interact electromagnetically with the spectroscopic target of interest thereby undergoing a change in its own electromagnetic properties. This change in the intermediary body is then detected by way of force-detected spectroscopy, providing indirect information on the target. If the change in the intermediary body can be made sufficiently large, then a net advantage in sensitivity is obtained. The intermediary body may be located outside the vacuum wall or may be an integral part of the vacuum wall, allowing an arbitrarily close approach to the target surface or molecule. It may be stationary with respect to the target or its geometry with respect to the target may be modulated. The mechanical resonator that interacts with it through the principles of force-detected spectroscopy may be located inside the vacuum wall thus achieving a low dissipation environment.

As an example of this concept, consider that the target molecule has an electromagnetic transition near frequency $\omega_s$, in the wavelength range (~$10^2$-~$10^4$ nm) over which it is known that nano-scale metal particles may have a plasmon resonance or other quantum dots may have quantum confined resonances. The irradiation of the composite system of target molecule and intermediary nanoparticle with the frequency $\omega_s$ induces an electromagnetic polarization in the intermediary body that depends in part on the presence of the response of the target molecule to that same frequency. This part of the polarization is approximately described as an image dipole of the molecule in the nanoparticle. The further irradiation of the probe at frequency $\omega_p$ will drive the mechanical resonator with a force at $\omega_p-\omega_s$ CO near its resonance frequency $\omega_h$. Detection of the resulting mechanical displacement is achieved by irradiation with a possibly different frequency $\omega_d$ and detection of the motional sidebands at $(\omega_d \pm n\omega_h)$. In the present invention, this may be enhanced by the near-field interaction of the moving probe with the intermediary body which interaction modulates their composite cross section. Thus this example embodies both that concept and the use of the resonance of the intermediary body to amplify the (resonant) response of the target. Together these principles comprise a new form of spectroscopy, combining principles of near-field enhancement, force-detection, and the dependence of scattering cross sections on the relative geometry of parts of the scatterer.

Figure 4A:
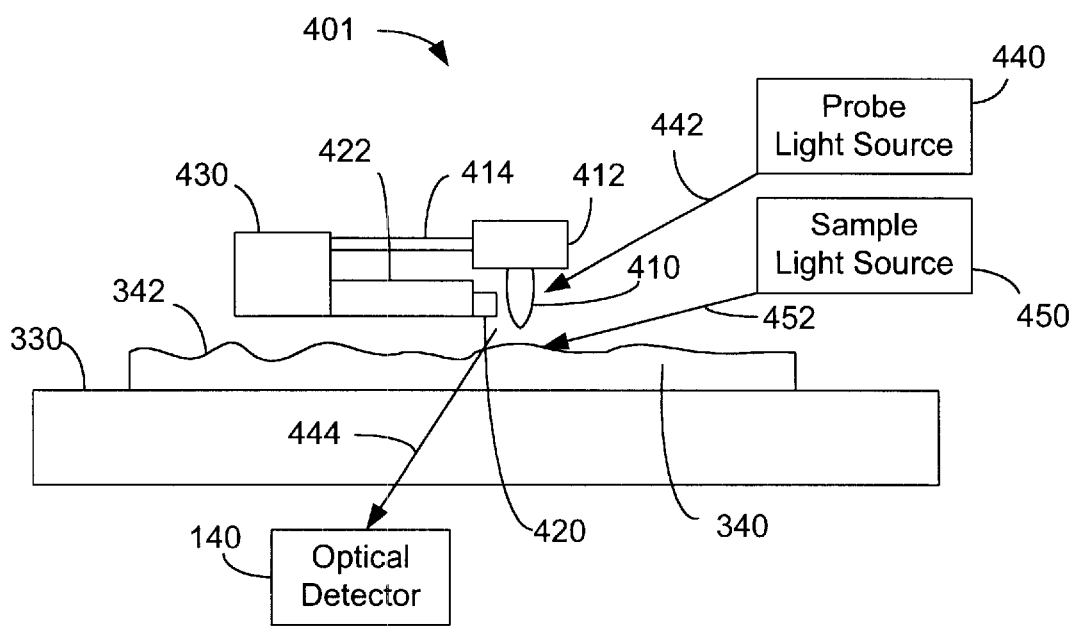
FIGS. 4A and 4B show examples of force-detected scanning optical microscopes based on resonance-enhanced configurational effects.
Figure 4B:
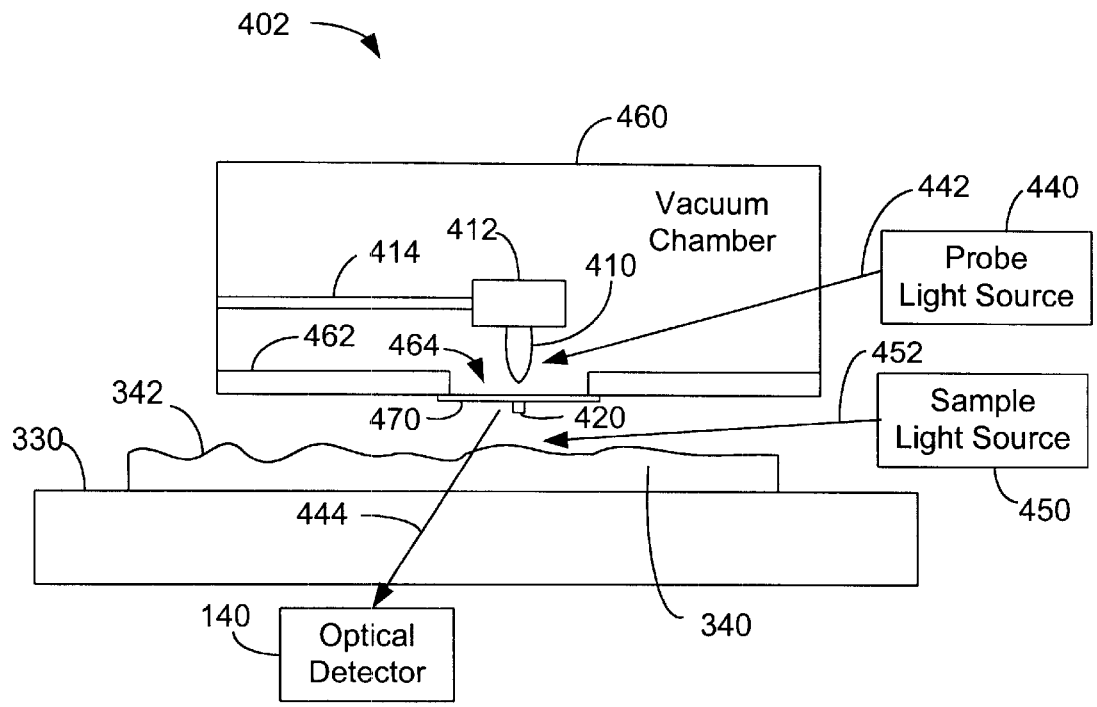

FIGS. 4A and 4B shows two exemplary force-detected optical scanning microscopes 401 and 402 by designing the probe based on the configurational mechanism shown in FIG. 1. FIG. 4A shows the basic design which improves over the systems disclosed in U.S. application Ser. No. 09/576, 654, entirety of which is incorporated herein by reference. The basic design concept is to create and detect a force interaction between a sample 340 and a probe tip 410 to measure properties of the sample 340 such as its surface profile. A probe excitation optical field 442 is generated from a probe light source 440 and is coupled to the probe 410 formed of a polarizable material. This produces a probe polarization. A sample light source 450 is used to generate a sample excitation optical field 452 to the sample 340, generally at a different frequency from the frequency of the probe field 442. The sample 340 responds to the field 452 to produce a sample polarization which interacts with the field of the probe polarization. This field overlapping in space effectuates a localized interaction between the probe 410 and the sample 340. A mechanical oscillator 414 is engaged to at least one of the probe 410 and the sample 340 and moves in response to the sample-probe interaction. The motion of the oscillator 414 is then detected and is used to measure a property of the sample 340. The probe 410 and the sample 340 may be scanned relative to each other in space to measure different locations on the sample 340. The sample holder 330, for example, may be placed on a translational stage to move the sample 340. As illustrated, the mechanical oscillator 414 is coupled to the probe 410 through a probe holder 412. In particular, a nano-scale part 420 is placed adjacent to the probe 410 by a distance less than one wavelength of the optical energy to form a pair with the probe 410 to produce the configurational effects as in the pair formed by the parts 110 and 120 in FIG. 1. A holder 422 may be used to hold the nano-scale part 420 to a fixture 430 which may also be engaged to the mechanical oscillator 414. Different from other force-detected optical scanning microscopes, the scattered signal 444 produced by the nano-structure pair of the part 420 and the probe 410 is collected at a detector 140 as an additional signal to measure a signal variation caused by the configurational change between the probe 410 and the nano-scale part 420. This signal is enhanced by the optical resonance in form of either a plasmon resonance or a quantum-confined resonance and would not be measurable by other force-detected optical scanning microscopes.

FIG. 4B shows a specific implementation 402 of the design 401 in FIG. 4A where the probe 410 and the mechanical oscillator 414 are placed in a vacuum chamber 460 to reduce the damping and to further enhance the detection sensitivity. A semiconductor substrate 462 may be used as the vacuum wall. A through opening 464 is formed on the substrate 462 to receive the probe tip 410. A thin film 470 such as silicon nitride may be formed to seal off the opening 464. The thickness of the thin film 470 may be less one wavelength of the optical energy, e.g., a few tens of nanometers. A nano-scale part 470, e.g., a gold particle, may be fixed to the film 470 outside the vacuum chamber 460 and is spaced from the probe tip 410 less than one wavelength to form the pair for producing the configurational effects.

Figure 5:
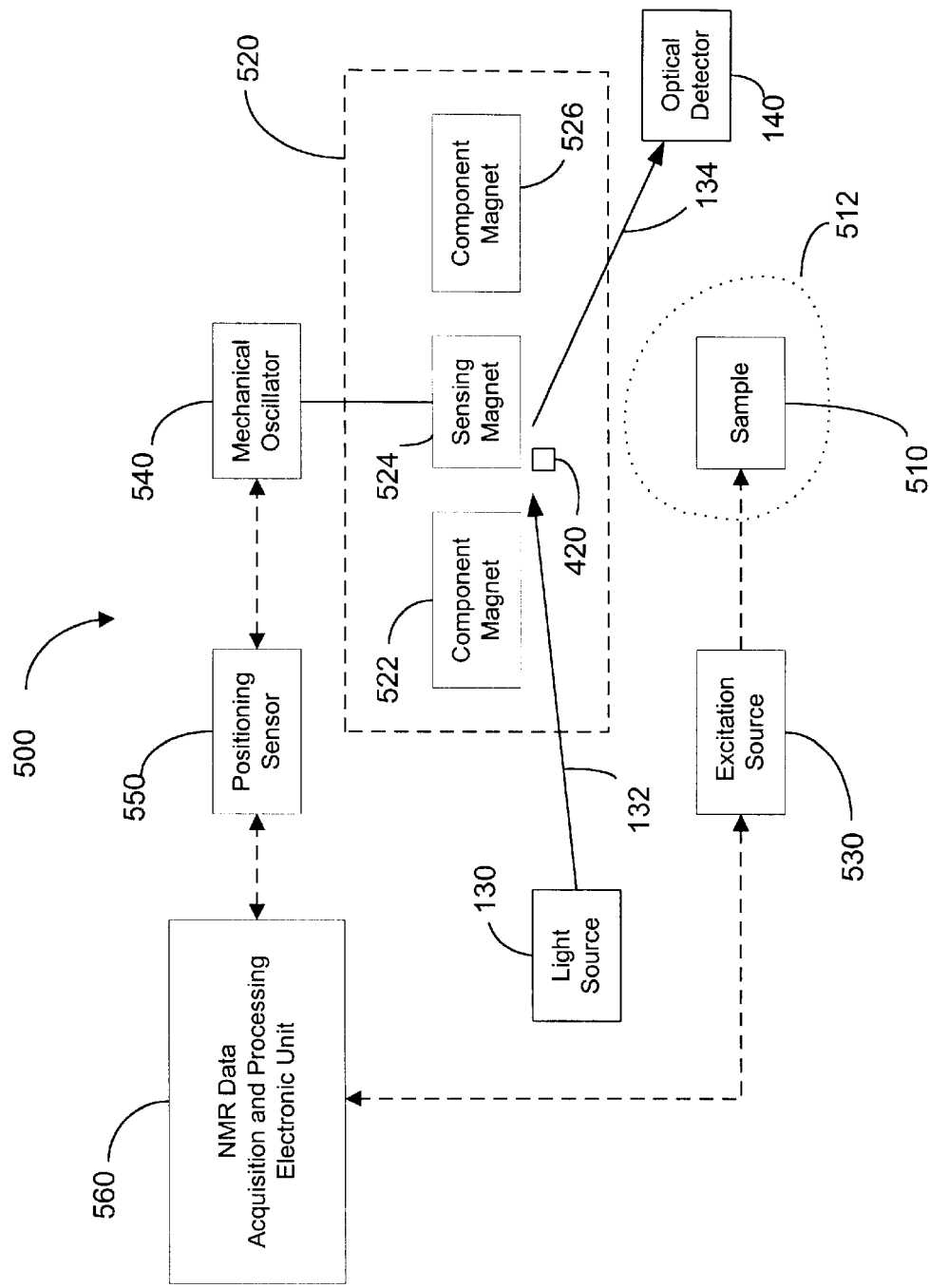
FIG. 5 shows one embodiment of a force-detected NMR system based on resonance-enhanced configurational effects.

FIG. 5 further shows a force-detected magnetic resonance system 500 based on the above configurational effects. Certain features of this system is disclosed in U.S. Pat. No. 6,100,687, the entirety of which is incorporated herein by reference. A composite magnet assembly 520 has a plurality of component magnets 522, 526, and 526 distributed in a prespecified geometry with respect to a location 512 for placing a sample 510 and produces a static magnetic field. The composite magnet assembly 520 and the sample 510 are arranged with respect to each other so that the static magnetic field at the site of the sample 510 is substantially homogeneous. The homogeneity for the static magnetic filed may be characterized by the line broadening caused by the field inhomogeneity. According to the invention, the line broadening caused by the inhomogeneity is preferably smaller than the Rabi frequency. More preferably, a relative variation in the field magnitude across the sample is approximately about 1 part per million or less. Under such a homogenous condition, the total magnetic force exerted on the sample 510 by the magnet assembly 520 as a whole is substantially zero. According to the Newton's third law, the "inverse" magnetic force exerted on the composite magnet assembly 520 as a whole by the sample 510 is also substantially zero.

Although the net magnetic force exerted on the magnet assembly 520 by the sample 510 is substantially zero, an individual magnet in the magnet assembly 520 may experience a non-zero force induced by the field gradient produced by the magnetization of the sample 510. The field gradient of the sample 510 may measurably distort the composite magnet assembly 520 as a whole by spatially moving the component magnets relative to one another. This unique configuration can be accomplished for a given sample by choosing the desired geometrical and magnetic properties of the magnet assembly and the induced magnetization profile of the sample.

Hence, one or more component magnets in the magnet assembly 520 may be used as sensing magnets to detect the magnetization of the sample 510. A component magnet in the magnet assembly that is closest to the sample may be preferably chosen for detection in order to increase the detection sensitivity. A component magnet 524 in FIG. 5 is shown as one sensing magnet. In certain cases, the size of a sensing magnet may be made similar to that of the sample 510. The position of a sensing magnet 524 can be moved by the magnetic force exerted by the sample 510. As the magnetization of the sample 510 changes, the magnetic force on a sensing magnet changes accordingly, so does the position of the sensing magnet 524. Therefore, the positioning information of a sensing magnet 524 has a correlation with the magnetization of the sample 510. This forms the basis for the force-detected NMR measurements of the present invention. The position of a sensing magnet 524 in response to the modulation of the magnetization of the sample 510 by the rf excitation field is extracted to produce the NMR signal.

The sensing magnet 524 in the magnet assembly is mechanically coupled to a mechanical oscillator 540 with a high quality factor QF and a resonance frequency $\omega_F$. The nonmagnetic mass of the mechanical oscillator 540 should be minimized to enhance the detection sensitivity. The mass of the sensing magnet 524 affixed onto the oscillator 540, however, can be configured to be an optimal mass for maximizing the sensitivity. Two seemingly competing effects may be included in the determination of the optimal mass for the sensing magnet. In one hand, the smaller the total mass of the oscillator 540 and the sensing magnet 524, the more sensitive is the amplitude of the motion of the oscillator 540 in response to a given force. This indicates that the mass of the sensing should be reduced. On the other hand, the magnetic force on the sensing magnet 524 increases with the magnet size for a given gradient field of the sample because the magnetic coupling between the sample's gradient field and the sensing magnet 524 increases with the magnet size. However, the mass of the sensing .magnet 524 increases with its size. Therefore, the optimal mass for the sensing magnet 524 is determined by balancing these two effects to achieve a maximal detection sensitivity. In addition, the geometry of the sensing magnet 524 with respect to the field gradient of the given sample 510 may also be considered in maximizing the sensitivity.

An excitation source 530 can be used to produce a time-varying magnetic field at the sample 510 to modulate the magnetization of the sample 510 that is induced by the homogeneous static field. In many practical applications, this excitation source 530 may be a rf source. The modulation of the magnetization by the rf can be converted into the mechanical oscillation of the oscillator which is usually in the audio-frequency range. The modulation by the rf may be chosen so that the induced oscillation of the oscillator is near or at the resonance frequency $\omega_F$. This condition is preferred in order to increase the,detection sensitivity.

The excitation source 530 as shown in FIG. 3 is a separate element from the composite magnet assembly 520. Alternatively, the excitation source 530 and the composite magnet assembly 520 may be integrated together as one unit to generate both the homogeneous static magnetic field and the time-varying excitation field at the sample. In addition, the composite magnet assembly 520 may include at least one electromagnet component magnet for producing the spatially homogeneous magnetic field at the sample 510 with other component magnets. The electromagnet component magnet can be used to change the magnitude or direction of the spatially homogeneous magnetic field at the sample in some operations such as modulating the magnetic force on a sensing magnet at a resonance frequency of the mechanical oscillator 540.

A positioning sensor 550 is used to measure accurately the position change of the oscillator 540 which is processed to generate a NMR signal. As previously described, the position of the oscillator 540 is determined by the magnetization of the sample 510. The modulation of the sample magnetization can be represented by the AC component of the position deflection at the resonance frequency $\omega_F$ effected by the magnetic force exerted on the sensing magnet 524.

The amplitude of the AC deflection is proportional to the magnitude of the magnetization in the sample 510. The DC component of the position deflection is usually present merely as a bias.

Alternatively, the NMR signal detection can be implemented by a feedback scheme. An electrically-controllable positioning actuator (e.g., a piezo actuator) can be used to cancel the movement of the oscillator due to the magnetic force exerted on the sensing magnet. Alternatively, additional controlled forces (e.g. coulombic or magnetic) could be applied to the oscillator to cancel the NMR related force. Hence, the position of the oscillator 540 and the sensing magnet 524 remains substantially unchanged from their equilibrium position. An electrical feedback mechanism is used to feed back an AC signal to control the positioning actuator, canceling the AC deflection. The amplitude of the AC feedback signal can be used to extract the sample magnetization. See, for example, Mertz et al, Applied Physics Letters, Vol. 62, p. 2344, 1993 and McCombie, Rep. Prog. Phys., Vol. 16, p. 266, 1953, which are incorporated herein by reference. This feedback NMR detection scheme may have advantages in some applications over the direct detection of the oscillator positioning. For example, the linearity of the oscillator can be better maintained since the displacement of the oscillator is very small. Also, the homogeneity of the static field across the sample affixed on the oscillator can be better maintained also due to the small displacement.

The data acquisition and processing are controlled and performed by an electronic unit 560. As shown in FIG. 5, the electronic unit 560 also controls the rf excitation source to modulate the magnetization of the sample 510 in a desired mode. For example, a pulsed modulation with a certain pulse sequence may be generated and a Fourier transform may be performed by the electronic unit to extract a NMR frequency spectrum of the sample. The electronic unit 560 may also control certain aspects of the composite magnet assembly such as the magnitude of the static magnetic field at the sample, the equilibrium position of the sensor magnet(s), currents in field-shimming coils placed near the sample 510, etc.

Various devices may be used to implement the force-detected NMR system of FIG. 5. A magnet in the composite magnet assembly 520 can be a permanent magnet made of a ferromagnetic material, an electromagnet or a combination thereof. A ferromagnetic magnet may be preferred as a sensing magnet in some cases. The mechanical oscillator may be any type of micro-mechanical oscillator such as a silicon membrane or cantilever. The positioning sensor may be an optic fiber interferometric sensor, an electron tunneling sensor a piezorosistive sensor, or a capacitive sensor. The rf excitation source may be a rf coil. The electronic unit may include a microprocessor.

Notably, a nano-scale part 420 is placed adjacent to the sensing magnet 52A by a distance less than one wavelength of the optical energy to form a pair with the sensing magnet 524 to produce the configurational effects as in the pair formed by the parts 110 and 120 in FIG. 1. The sensing magnet 524 may be an optically polarizable material or is coated with such a material that faces the nano-scale part 420. The scattered signal 134 produced by the nano-structure pair of the part 420 and the sensing magnet 524 is collected at a detector 140 as an additional signal to measure a signal variation caused by the configurational change between the sensing magnet 524 and the nano-scale part 420. This signal is enhanced by the optical resonance in form of either a plasmon resonance or a quantum-confined resonance and would not be measurable. Similar to the design in FIG. 4B, the mechanical oscillator 540 may be enclosed in a vacuum chamber to reduce the damping.

Figure 6:
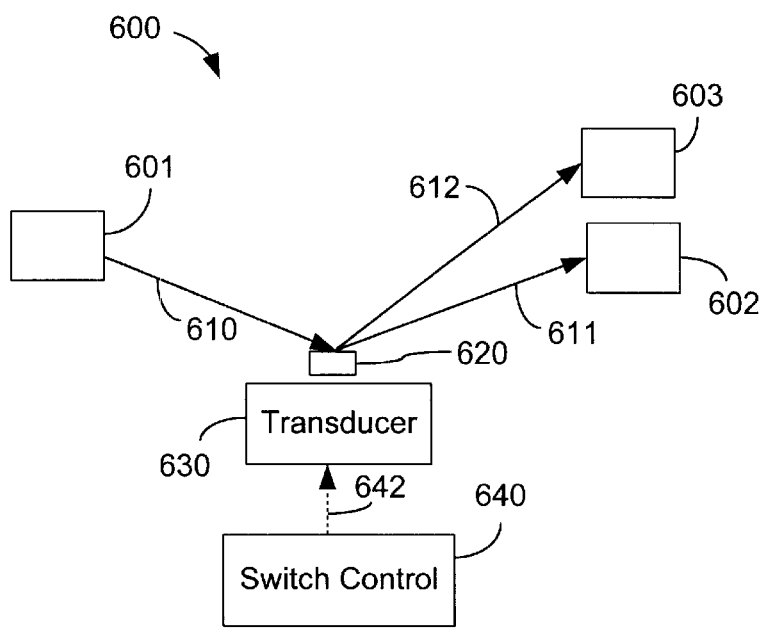
FIG. 6 shows an optical switch based on resonance-enhanced configurational effects.

FIG. 6 illustrates an optical switch 600 based on the resonance-enhanced configurational effects. The switch 600 includes a switching element 620, a switch transducer 630, and a switch control unit 640. An optical input port 601 and two optical output ports 602 and 603 are located with respect to the switching element 620 so that an input beam 610 from the input port 601 may be directed either to the output port 602 along a direction 611 or to the output port 603 along another direction 612. The switching element 620 may be formed of the nano-structure shown in FIG. 1 with at least one pair of particles 110 and 120 that can move relative to each other. The switch transducer 630 is placed adjacent to the particles 110 and 120 to generate either a force or a torque to cause a change in the relative geometry or configuration of the two particles 110 and 120 in response to a control signal 642 from the control unit 640. Hence, when the transducer 630 sets the switching element 620 in a first configuration, the beam 610 is directed to the direction 611. When the transducer 630 sets to a second configuration, the beam 610 is directed to the direction 612. The transducer 630 may interact with the switching element 620 through mechanical, electrical, magnetic, optical forces or thermal expansion.

Only a few embodiments are disclosed. However, it is understood that variations and enhancements may be made. For example, when both parts 110 and 120 in FIG. 1 are operable to produce optical resonances, one may exhibit a plasmon resonance while the other may exhibit a quantum-confined resonance. Also, the relative geometric configuration of the nano-scale pair formed of parts 110 and 120 in FIG. 1 may be used as an optical memory unit in which different configurations represent different memory states for storing data. A plurality of such pairs may be used to form an array of optical memory units. The data may be stored in form of directions, amplitudes, frequency shifts of the scattered beams from such pairs. All these and other variations and applications are intended to be encompassed by the following claims.

What is claimed is:

1. An optical device, comprising:
   a first part with a dimension less than one wavelength of an input optical signal; and
   a second part spaced from said first part by less than one wavelength of said input optical signal,
   wherein at least one of said first and said second parts is formed of a material responsive to said input optical signal to produce an optical resonance at or near said wavelength of said input optical signal, and
   wherein said first and said second parts are arranged to be movable relative to each other and are operable to interact with each other to change a property of an output optical signal produced from scattering said input optical signal as a relative geometric configuration between said first and said second parts changes.

2. The device as in claim 1, wherein said first part exhibits an electric conductivity and produces a plasmon resonance in.response to said input optical signal.

3. The device as in claim 2, wherein said'second part exhibits an electric conductivity and produces a plasmon resonance in response to said input optical signal.

4. The device as in claim 2, wherein said second part is designed to produce a quantum-confined optical resonance in response to said input optical signal.

5. The device as in claim 4, wherein said second part includes a quantum dot.

6. The device as in claim 1, said-first part is designed to produce a quantum-confined optical resonance in response to said input optical signal.

7. The device as in claim 1, wherein said first and said second parts are movable relative to each other in a harmonic motion.

8. The device as in claim 1, wherein said property includes a signal amplitude.

9. The device as in claim 1, wherein said property includes a signal polarization.

10. The device as in claim 1, wherein said property includes a signal frequency.

11. The device as in claim 1, wherein said property includes a signal direction.

12. An optical device, comprising:
an optical switching element having at least a first part and a second part whose dimensions are less than one wavelength of an input optical signal, at least said first part formed of a nanoscale material to exhibit a resonance in response to said input optical signal, wherein said first and said second parts spaced by less than one wavelength of said input optical signal and arranged to be movable relative to each other to change a direction of an output optical signal produced from scattering said input optical signal as a relative geometric configuration between said first and said second parts changes; and
a switch transducer placed adjacent to said optical switching element and operable to cause a change in said relative geometric configuration in response to a control signal.

13. The device as in claim 12, wherein said switch transducer is operable to cause said change by a mechanical force.

14. The device as in claim 12, wherein said switch transducer is operable to cause said change by an electrical force.

15. The device as in claim 12, wherein said switch transducer is operable to cause said change by an optical interaction.

16. The device as in claim 12, wherein said switch transducer is operable to cause said change by a thermal expansion.

17. An optical device, comprising:
a probe tip having at least a first part and a second part, at least one of which has a dimension less than one wavelength of an input optical signal, and at least said first part formed of a material to exhibit an optical resonance in response to said input optical signal, wherein said first and said second parts are spaced by less than one wavelength of said input optical signal and are arrranged to be movable relative to each other to change a property of an output optical signal produced from scattering said input optical signal as a relative geometric configuration between said first and said second parts changes;
a sample platform configured to hold a sample with a sample surface to be measured;
a probe holder engaged to said probe tip and configured to hold said probe tip over said sample surface;
a light source operable to produce said input optical beam; and
an optical detector positioned relative to said probe tip to receive said output optical signal produced by said probe tip and operable to produce a detector output that indicates a property of said sample surface.

18. The device as in claim 17, further comprising a scanning mechanism to scan said probe tip relative to said sample surface.

19. The device as in claim 17, wherein said first part exhibits an electric conductivity and produces a plasmon resonance in response to said input optical signal.

20. The device as in claim 17, wherein said first part is designed to produce a quantum-confined optical resonance in response to said input optical signal.

21. An optical device, comprising:
a radiation source to produce at least a probe excitation wave at a probe frequency;
a probe responsive to a probe excitation wave to produce a probe polarization;
a mechanical oscillator coupled to said probe to oscillate in response to an energy applied to said probe;
a nano-structure part with a dimension less than one wavelength of said probe excitation wave and arranged to be movable relative to said probe, wherein said nano-structure part is responsive to said probe excitations wave and is operable to interact with said probe to change a property of an output optical signal produced from scattering received optical energy as a relative geometric configuration between said nano-structure part and said probe changes;
a sample holder to hold a sample with a sample polarization in a proximity of said probe to expose the sample to a field produced by at least said probe polarization so as to cause a motion of said mechanical oscillator;
a detector module to measure movements of said mechanical oscillators; and
an optical detector to collect and measure said output optical signal.

22. The device as in claim 21, further comprising a vacuum chamber enclosing said mechanical oscillator.

23. The device as in claim 21, wherein said nano-structure part exhibits an electric conductivity and produces a plasmon resonance in response to said probe excitation.

24. The device as in claim 21, wherein said nano-structure part is designed to produce a quantum-confined optical resonance in response to said probe excitation.

25. A device, comprising:
a sample holder to hold a sample;
a magnetic assembly to produce a static magnetic field at said sample holder and configured to include at least one sensing magnet to detect magnetic spin information of the sample;
an excitation source to produce a time-varying magnetic field at said sample holder;
a mechanical oscillator coupled to one of said sensing magnet and said sample holder to change a relative position between said sensing magnet and the sample in response to a magnetic interaction between said sensing magnet and the sample;
an optical probe source to produce a probe beam that excites an optical polarization in said sensing magnet;
a nano-structure part with a dimension less than one wavelength of said probe beam and arranged to be movable relative to said sensing magnet, wherein said nano-structure part is responsive to said probe beam and is operable to interact with said sensing magnet to change a property of an output optical signal produced from scattering said probe beam as a relative geometric configuration between said nano-structure part and said sensing magnet changes.

26. The device as in claim 25, further comprising a vacuum chamber enclosing said mechanical oscillator.

27. The device as in claim 25, wherein said nano-structure part exhibits an electric conductivity and produces a plasmon resonance in response to said probe beam.

28. The device as in claim 25, wherein said nano-structure part is designed to produce a quantum-confined optical resonance in response to said probe beam.

* * * * *